United States Patent
Mehlhorn et al.

(10) Patent No.: US 6,285,808 B1
(45) Date of Patent: Sep. 4, 2001

(54) CIRCUIT CARRIER WITH AN OPTICAL LAYER AND OPTOELECTRONIC COMPONENT

(75) Inventors: Torsten Mehlhorn, Berlin; Peter Birkholtz; Walter Pröbster, both of München, all of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/334,226

(22) Filed: Jun. 16, 1999

(30) Foreign Application Priority Data

Jun. 16, 1998 (DE) .............................. 198 26 648

(51) Int. Cl.$^7$ ....................................... G02B 6/12
(52) U.S. Cl. ............................. 385/14; 385/131
(58) Field of Search .................. 385/88–94, 14, 385/49, 131

(56) References Cited

U.S. PATENT DOCUMENTS

| | | | |
|---|---|---|---|
| 5,550,941 | * | 8/1996 | Lebby et al. ............... 385/49 |
| 5,625,734 | * | 4/1997 | Thomas et al. ............ 385/88 |
| 5,764,832 | * | 6/1998 | Tabuchi ..................... 385/49 |
| 6,064,783 | * | 5/2000 | Congdon et al. .......... 385/15 |

FOREIGN PATENT DOCUMENTS

| | | |
|---|---|---|
| 4406335A1 | 9/1995 | (DE) . |
| 19501285C1 | 5/1996 | (DE) . |
| 0366974A1 | 5/1990 | (EP) . |

* cited by examiner

*Primary Examiner*—Hung N. Ngo
(74) *Attorney, Agent, or Firm*—Herbert L. Lerner; Laurence A. Greenberg; Werner H. Stemer

(57) ABSTRACT

A circuit carrier includes several layers of at least one insulating material and conductor structures located on or in the layers. At least one of the layers is an optical layer which is embedded on both sides in other layers. An optoelectronic component for a circuit carrier is also provided.

16 Claims, 2 Drawing Sheets

CIRCUIT CARRIER WITH AN OPTICAL LAYER AND OPTOELECTRONIC COMPONENT

BACKGROUND OF THE INVENTION

Field of the Invention

The invention relates to a circuit carrier including several layers of at least one insulating material and conductor structures located on or in the layers. The invention also relates to an optoelectronic component which has connections for surface mounting on a circuit-carrier and also has at least one optical connection.

Such circuit carriers are known and are generally constructed as circuit boards which simultaneously act as mechanical carriers of components that are fixed to the circuit board through diverse soldering processes and are electrically connected with the conductor structures. Mostly multi-level circuit boards are used which have conductor structures at least on both of their outer surfaces and often on their inner surfaces as well and through-contacts are frequent. Depending on the requirements set by climatic conditions, component density, etc., such circuit carriers are made from epoxy-resin glass fabrics or from other synthetic materials such as polyester, polyamide or polytetrafluoroethylene. Equipping the circuit boards, usually with so-called SMD components, is mostly performed fully automatically.

In view of the advantages of optical methods of transmitting information, there is an increasing trend toward the use of optoelectronic components which emit and/or receive light. Flexible optical fibers are also used for connecting such optoelectronic components on circuit boards. Although a diversity of connection and plug-in techniques have been developed for connecting the optical fibers with the optoelectronic components, it is clear that none of those techniques is really suitable for automated assembly of the circuit board, in which the optical connections function outside the actual circuit board or circuit carrier.

SUMMARY OF THE INVENTION

It is accordingly an object of the invention to provide a circuit carrier with an optical layer and an optoelectronic component, which overcome the hereinafore-mentioned disadvantages of the heretofore-known devices of this general type and which integrate optoelectronic components with circuit carriers in such a way that, in addition to reliable operation, above all a simple and automated fabrication and assembly of the circuit carriers is made possible.

With the foregoing and other objects in view there is provided, according to the invention, in a circuit carrier, comprising several layers of at least one insulating material and conductor structures located on or in the layers, at least one optical layer having two sides; other layers in which both of the sides of the at least one optical layer are embedded; at least one surface-mountable electro-optical component disposed at least at one of the sides, the electro-optical component having at least one optical connection and electrical connections; a surface of the circuit carrier having a bore formed therein extending at least to within the at least one optical layer; and an optical deflecting system disposed in the vicinity or region of the at least one optical layer.

As a result of the invention, surface-mountable electro-optical components can be fixed in the usual way to circuit carriers, in particular to circuit boards, e.g. through soldering, and the optical connection with the optical layer is made at the same time. As a consequence it is possible to dispense with the conventional connections with optical fibers, etc., at the surface of the circuit board.

In accordance with another feature of the invention, the optical connection of the electro-optical component has an optical or fiber-optic waveguide stub or support rising in the bore. As a result the component can be placed in an automatic insertion machine at the intended position without the necessity for further process steps with respect to the optical connection.

In accordance with a further feature of the invention, in order to achieve economical and low-loss light deflection, the stub can be fitted with a deflecting mirror or deflecting prism at its end facing away from the component.

In accordance with an added feature of the invention, with respect to the assembly process, it is advantageous if the optical waveguide stub forms an integral part of the electro-optical component.

In accordance with an additional feature of the invention, with regard to flexibility of application, the optical waveguide stub can also be a part which is separate from the electro-optical component. It should also be pointed out that transmission of light within the bore could also take place without the use of a stub.

In accordance with yet another feature of the invention, remaining spaces within the bore are filled out with a filling material which reduces reflection and/or absorption. In accordance with yet a further feature of the invention, in most cases it is also advantageous if the light deflecting system is constructed for a deflection of 90°, although special cases are also possible in which diffuse deflection or deflection through a different angle takes place.

In accordance with yet an added feature of the invention, with regard to protection of the optical connection of the electro-optical component it is useful in the majority of cases if the optical connection is located on the bottom of the component facing towards the circuit carrier. This also provides the shortest path from the connection to the optical layer.

In accordance with yet an additional feature of the invention, in other cases it can be useful if the optical connection of the electro-optical component is located at a side surface and the optical waveguide stub also has a light deflecting system in the area of the optical connection. Due to this double 90° deflection, electro-optical components can be used which can also be used if necessary for conventional circuit carriers with other connection technologies.

In accordance with again another feature of the invention, the optical layer is a polyimide layer.

With the objects of the invention in view there is also provided an optoelectronic component, comprising connections for surface-mounting on a circuit carrier; a lower surface facing the circuit carrier; and at least one optical connection disposed at the lower surface. In this way the connection with an optical layer within the circuit carrier can be made in the simplest way and can be mechanically protected.

In accordance with a concomitant feature of the invention, the optical connection has a round, protruding optical waveguide stub and this optical waveguide stub can have a deflecting prism or deflecting mirror at its free end.

Other features which are considered as characteristic for the invention are set forth in the appended claims.

Although the invention is illustrated and described herein as embodied in a circuit carrier with an optical layer and an optoelectronic component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
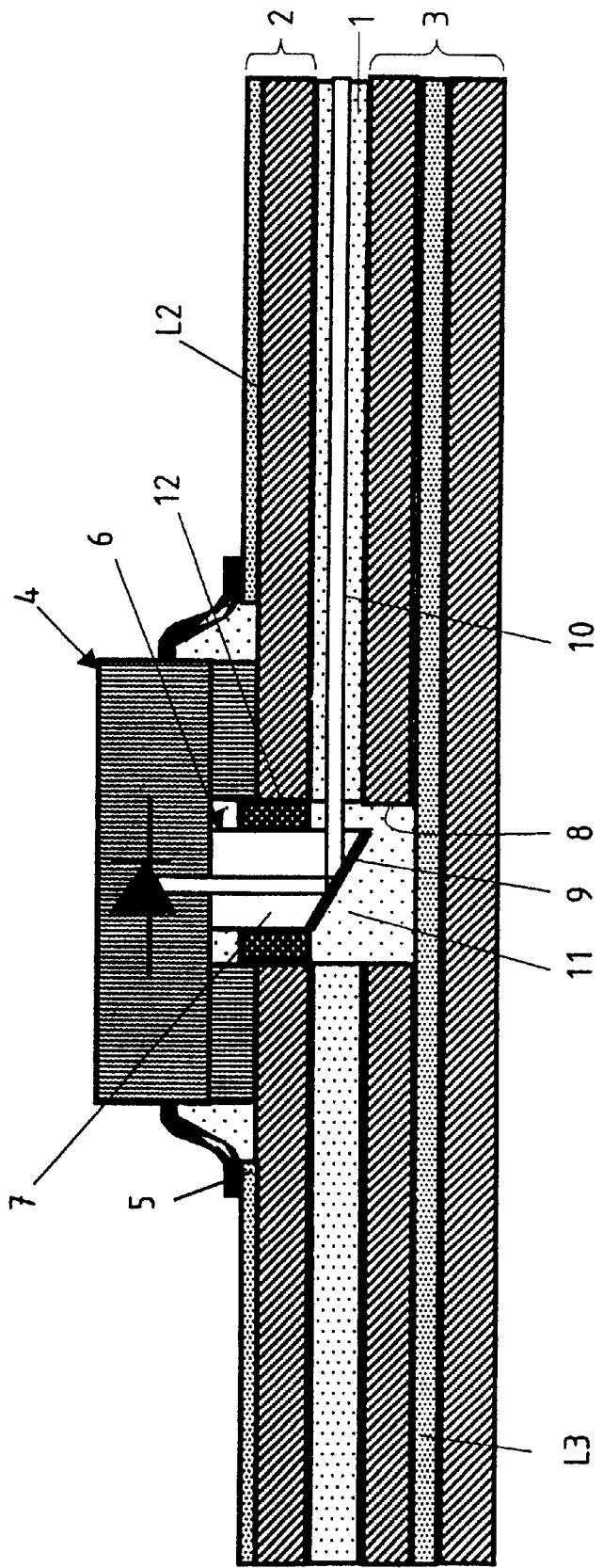
FIG. 1 is a diagrammatic, sectional view of a circuit carrier according to the invention, on which an optoelectronic component according to the invention is mounted.

Referring now to the figures of the drawings in detail and first, particularly, to FIG. 1 thereof, there is seen a circuit carrier according to the invention that includes an optical layer 1 which, for example, can be formed of polyimide. The material of the optical layer 1 can also be optically active, so that it can be electro-optically influenced through an application of signals, e.g. it can be stimulated to emit light. The optical layer 1 is surrounded on both sides by a circuit board layer 2 disposed above in the drawing and a circuit board layer 3 disposed below in the drawing, or it may be embedded in these layers 2, 3. The circuit board layer 2 has a conductor structure L2 and the circuit board 3 has a conductor structure L3. These structures L2 and L3 are prepared in a known manner, for example through the etching of copper coatings.

The structure formed of the layers 1, 2 and 3 is fabricated by conventional laminating processes, if necessary including the use of thermally conducting intermediate layers of a prepreg. An electro-optical component 4 is attached, e.g. through soldering, to the surface of the circuit board layer 2 through the use of electrical connections 5 with the conductor structure L2. The electro-optical component 4 can be active or passive, i.e. it can emit light or it can accept light signals and convert them into electrical signals. This is indicated by a diode symbol. The optoelectronic component has an optical connection 6 which is disposed on a lower surface of the component 4 facing towards the circuit carrier and it has an optical or fiber-optic waveguide stub or support 7 at that location. This stub rises in a bore 8 formed in a carrier surface of the circuit carrier and has an optical deflecting system 9 at its lower end. The optical deflecting system 9 can be realized as a prism or a mirror and is positioned in such a way that a light beam designated with reference numeral 10 is deflected through 90°. In the illustration shown in FIG. 1 the light emitted from the optoelectronic component 4 travels in a beam vertically downwards through the stub 7 and is deflected in the optical deflecting system 9 by 90° so that it enters the optical layer 1, in this case horizontally. The light then travels to further components, whereby it is deflected again, or it travels to a connector which has both electrical and optical contacts.

In order to minimize optical reflection and absorption transitions, free space remaining in the bore 8 can be filled out with a filling material 11, e.g. a contact gel or adhesive which is introduced beforehand. Similarly, the bore 8 can be sealed towards the top with a filling material 12 and the component 4 can be additionally fixed to the circuit carrier through the use of a gel or adhesive.

Figure 2:
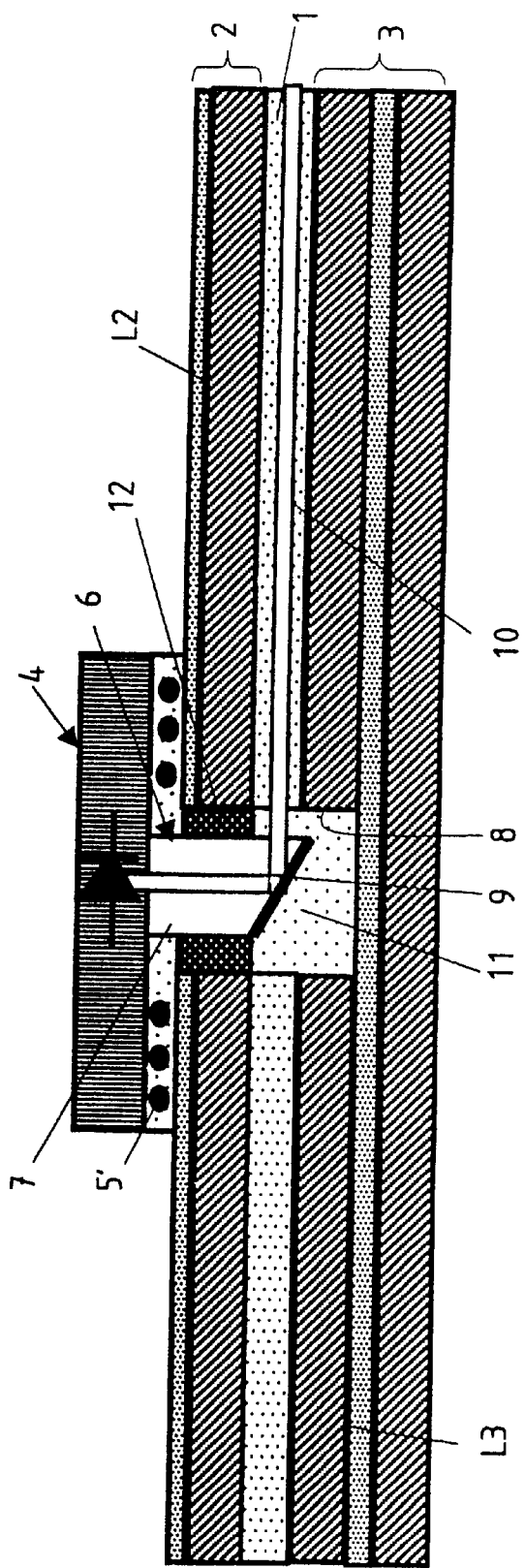
FIG. 2 is a view similar to FIG. 1, of a circuit carrier according to the invention on which an optoelectronic component is mounted using the ball grid array technique.

The circuit carrier shown in FIG. 2 has an optoelectronic component and corresponds essentially to that of FIG. 1. In the case of FIG. 2, however, the connections of the optoelectronic component are constructed in a ball grid array technique and electrical connections 5' at the underside of the component 4 are illustrated correspondingly as contact balls. The remaining parts are constructed in the same way and are therefore numbered identically to FIG. 1.

On one hand, it must be noted that the optical waveguide stub 7 including the optical deflecting system 9 can, if necessary, be realized as part of a combination with the optoelectronic component 4 for ease of assembly in an automatic insertion machine. On the other hand, it would also be possible to accommodate the optical waveguide connection including the light deflecting system in advance on or in the circuit carrier. The optical waveguide stub 7 is also not absolutely essential. It is possible for the light beam to travel through air, especially if light from outside is adequately blocked off. In a variant of the invention the optical connection can also be located at one side of the optoelectronic component and it would then be possible to lead the light to the optical layer 1 through the use of an appropriate optical waveguide stub with a double 90° deflection.

We claim:

1. A circuit carrier, comprising:
at least one optical layer having two sides;
other layers in which both of said sides of said at least one optical layer are embedded;
at least one surface-mountable electro-optical component disposed at least at one of said sides, said electro-optical component having at least one optical connection and electrical connections;
a carrier surface having a bore formed therein extending at least to within said at least one optical layer; and
an optical deflecting system disposed in the vicinity of said at least one optical layer.

2. The circuit carrier according to claim 1, wherein said optical connection of said electro-optical component includes an optical waveguide stub rising in said bore.

3. The circuit carrier according to claim 2, wherein said stub has an end facing away from said electro-optical component and a deflecting mirror at said end.

4. The circuit carrier according to claim 2, wherein said stub has an end facing away from said electro-optical component and a deflecting prism at said end.

5. The circuit carrier according to claim 2, wherein said optical waveguide stub is integral with said electro-optical component.

6. The circuit carrier according to claim 2, wherein said optical waveguide stub is a part separate from said electro-optical component.

7. The circuit carrier according to claim 1, wherein said bore has remaining spaces, and at least one of a reflection-reducing and absorption-reducing filling material fills out said remaining spaces.

8. The circuit carrier according to claim 1, wherein said optical deflecting system provides a 90° deflection.

9. The circuit carrier according to claim 1, wherein said electro-optical component has a lower surface facing said at least one optical layer, and said optical connection of said electro-optical component is disposed on said lower surface.

10. The circuit carrier according to claim 2, including a side surface on which said optical connection of said electro-optical component is disposed, said optical deflecting system of said optical waveguide stub disposed in the vicinity of said optical connection.

11. The circuit carrier according to claim 1, wherein said at least one optical layer is a polyimide layer.

12. An optoelectronic component, comprising:
   connections for surface-mounting on a circuit carrier;
   a lower surface facing the circuit carrier; and
   at least one optical connection disposed at said lower surface, said at least one optical connection having an optical waveguide stub protruding downwards.

13. The optoelectronic component according to claim 12, wherein said optical waveguide stub has a free end with an optical deflecting system.

14. The optoelectronic component according to claim 13, wherein said optical deflecting system is a deflecting prism.

15. The optoelectronic component according to claim 13, wherein said optical deflecting system is a deflecting mirror.

16. A circuit carrier, comprising:
   several layers of at least one insulating material;
   conductor structures disposed at said layers;
   at least one optical layer having two sides;
   other layers in which both of said sides of said at least one optical layer are embedded;
   at least one surface-mountable electro-optical component disposed at least at one of said sides, said electro-optical component having at least one optical connection and electrical connections;
   a carrier surface having a bore formed therein extending at least to within said at least one optical layer; and
   an optical deflecting system disposed in the vicinity of said at least one optical layer.

* * * * *